United States Patent [19]

Brahmbhatt

[11] Patent Number: 4,831,589
[45] Date of Patent: May 16, 1989

[54] EEPROM PROGRAMMING SWITCH OPERABLE AT LOW VCC

[75] Inventor: Dhaval J. Brahmbhatt, San Jose, Calif.

[73] Assignee: ICT International CMOS Technology, Inc., San Jose, Calif.

[21] Appl. No.: 146,048

[22] Filed: Jan. 20, 1988

[51] Int. Cl.$^4$ ............................................. G11C 11/40
[52] U.S. Cl. ............................... 365/189.09; 365/203; 365/230.01; 357/45
[58] Field of Search ............... 365/189, 203, 204, 182, 365/230; 357/45

[56] References Cited

U.S. PATENT DOCUMENTS 4,751,678 1/1988 Raghunathan ..................... 365/189

Primary Examiner—Terrell W. Fears
Attorney, Agent, or Firm—Flehr, Hohbach, Test, Albritton & Herbert

[57] ABSTRACT

An EEPROM or EPPROM programming switch operable at low circuit voltage ($V_{CC}$) includes a first pair of native field effect transistors interconnected between a word line and a programming voltage potential and a second pair of serially connected native transistor devices connected between a charge pump node and the programming voltage. The gate electrodes of the first pair of transistors are connected to the charge pump node and the gate electrodes of the second pair of transistors are connected to the word line. Decoding means is provided for preventing charge accumulation of the word line when the word line is not selected and for permitting charge accumulation of the word line when the word line is selected for programming. The common terminals of the first and second transistors and the third and fourth transistors are connected to a bias circuit for preventing conduction of the transistors when the word line has not been selected for programming.

10 Claims, 3 Drawing Sheets

EEPROM PROGRAMMING SWITCH OPERABLE AT LOW VCC

BACKGROUND OF THE INVENTION

This invention relates generally to programmable memories, and more particularly the invention relates to programming circuitry operable at low electrical voltage levels.

In the programming of electrical memories such as PROMs and EEPROMs a programming voltage on the order of 20 volts is required. With PROM devices an external power source is utilized. However, the programming of EEPROMs is accomplished using the chip operating voltage, typically 5 volts, with a high-voltage generator circuit in the chip developing the requisite programming voltage. In programming mode operation, a selected word line is raised to the programming voltage level sequentially by using a charge pump. See Brahmbhatt, U.S. Pat. No. 4,442,481, for "Low Power Decoder Circuit", and Gupta, U.S. Pat. No. 4,511,811, for "Charge Pump for Providing Programming Voltage to the Word Lines in a Semiconductor Memory Array".

It has become desirable to operate EEPROM devices from a battery source. However, a $V_{CC}$ of only approximately 2.2 volts might be available from the battery source rather than having a $V_{CC}$ of 5 volts. Circuit operation is not inhibited using the lower $V_{CC}$, but programming (charge pumping) of the EEPROM devices is impacted. In the devices in the Brahmbhatt and Gupta patents, supra, enhancement mode transistors are utilized and such transistors have threshold voltages of approximately 1.5 volts. Two such transistors are effectively connected in series in the $V_{PP}$ circuit path and thus require at least 3 volts for operation—well above the 2.2 volts available using a battery power source.

SUMMARY OF THE INVENTION

Accordingly, an objective of the invention is an EEPROM device which can operate from a battery source providing a $V_{CC}$ as low as 2.2 volts.

A feature of the invention is the use of native transistors in charge pump circuitry of an EEPROM.

Another feature of the invention is biasing means for use with native transistors in a charge pump circuit which prevents the native transistors from operating in a depletion mode.

Briefly, a word line activated for programming by an addressing circuit is connected to a programming voltage $V_{PP}$, through first and second serially connected native transistors (i.e., threshold approximately 0 volt). A terminal of the first transistor is connected to the word line, a terminal of the second transistor is connected to the programming voltage, and the common terminals of the first and second transistors are biased to prevent operation of the first and second transistors in a depletion mode. The gates of the first and second transistors are connected to one terminal (charge pump node) of a charge pump capacitor, the other terminal of the charge pump capacitor being connected to the clock voltage, $\phi$. The activated word line is charged incrementally through the first and second transistors until the word line approximates the voltage on the one terminal of the charge pump capacitor. The charge pump node or one terminal of the charge pump capacitor is connected to the programming voltage through third and fourth serially connected native transistors. A terminal of the third transistor is connected to the charge pump capacitor, a terminal of the fourth transistor is connected to the programming voltage, and the common terminals of the third and fourth transistors are biased to prevent operation of the third and fourth transistors in a depletion mode. The gates of the third and fourth transistors are connected to the word line whereby the one terminal of the charge pump capacitor is periodically charged to approximately the voltage on the word line. Thereafter, when the clock $\phi$ goes high, the charge on the one terminal of the capacitor is raised or pumped above the word line voltage by the voltage $\phi$, which might be as low as 2.2 volts. The raised voltage is connected to the gates of the first and second transistors, thereby rendering the transistors conductive and charging the word line incrementally to a value approximately equal to the voltage on the one terminal of the charge pump capacitor.

In one embodiment, the biasing means comprises native or enhancement mode transistor device diodes connecting $V_{CC}$ to the common terminals of the first and second transistors and the third and fourth transistors to prevent the transistors from operating in a depletion mode when the word line is not being programmed and thereby preventing a short circuit of $V_{PP}$ to the grounded, non-selected word line.

The invention and objects and features thereof will be more readily apparent from the following detailed description when taken with the appended drawing.

DETAILED DESCRIPTION OF ILLUSTRATED EMBODIMENTS

Figure 1:
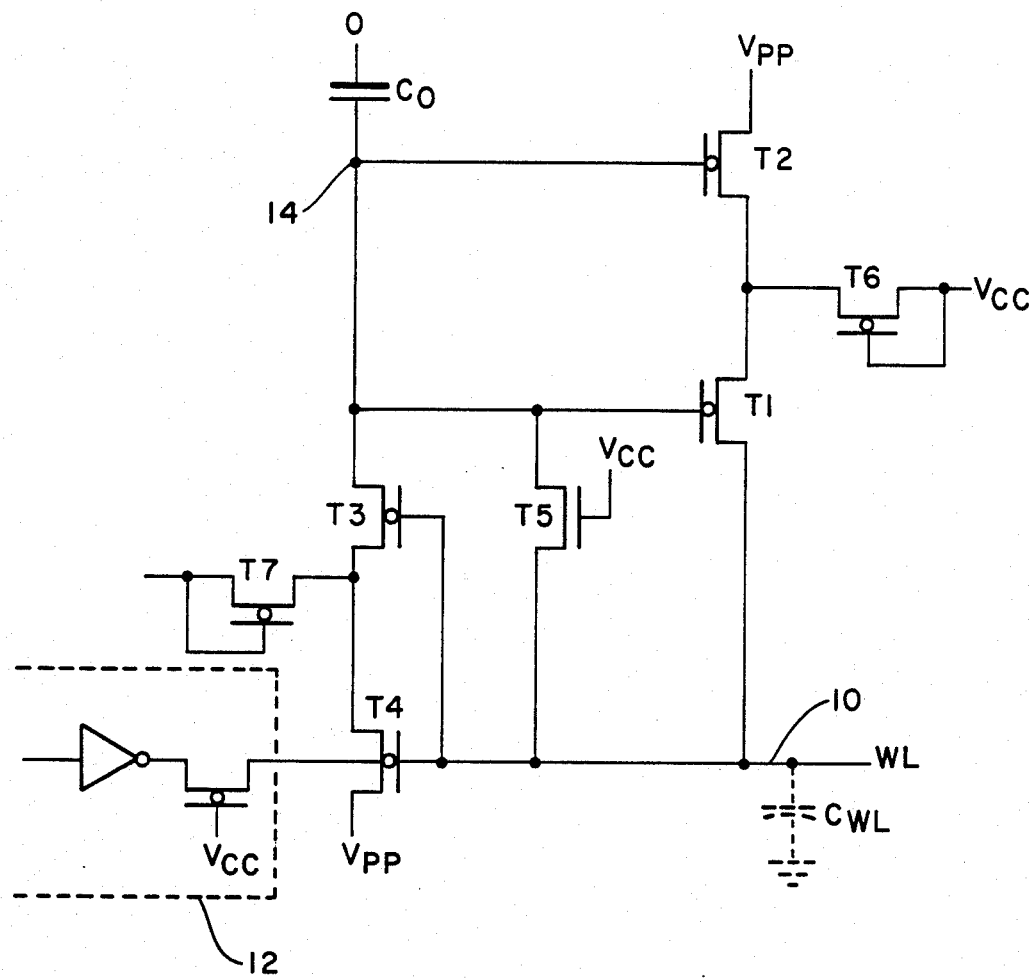
FIG. 1 is an electrical schematic of an EEPROM device and programming switch in accordance with one embodiment of the invention.

FIG. 1 is an electrical schematic of one embodiment of programming circuitry in accordance with the invention. A word line 10 is selected for programming by a decoding circuit shown generally at 12. The decoding circuitry is conventional such as disclosed in the Brahmbhatt and Gupta patents, supra, whereby an unselected word line is grounded and a selected word line is allowed to be charged to the programming voltage $V_{PP}$. The capacitance, $C_{WL}$, of the word line is indicated by a broken line. The programming voltage is generated by a conventional circuit in the EEPROM as derived from the supply voltage $V_{CC}$ of the circuit. The programming clock, $\phi$, is applied across a capacitor $C_\phi$ in the circuit. The capacitor $C_\phi$ can be an enhancement mode transistor or a native transistor.

Native transistors T1 and T2 are serially connected between the word line 10 and the programming voltage $V_{PP}$, and the transistors T3 and T4 are serially connected programming voltage $V_{PP}$. The gates of transistors T1 and T2 are connected to the charge pump terminal of the capacitor $C_\phi$ and the gates of transistors T3 and T4 are connected to the word line 10. An enhancement mode transistor T5 is connected between the charge pump terminal of capacitor $C_\phi$ and the word line 10 to deplete any stored charge when the word line is not to be charged to the programming potential $V_{PP}$.

Because of the small voltage drop across the native transistors T1-T4, (on the order of 0.2-0.7 volt depending on temperature) the transistors can operate in the charging circuit when $V_{CC}$ is on the order of only 2+ volts since the voltage drop across the serially connected pair of transistors is 0.4 to 1.4 volts.

A potential problem in using native transistors in the charge pumping circuit lies in the transistors possibly operating in a depletion mode and thus providing a short circuit between $V_{PP}$ and an unselected word line. In accordance with one feature of the invention, voltage biasing means is provided to prevent such an enhancement mode of operation of the native transistors. This is accomplished by connecting $V_{CC}$ through native transistor diodes to the common terminals of transistor T1 and T2 and to the common terminal of transistors T3 and T4. Thus, when the word line 10 is grounded transistors T2 and T4 cannot be turned on and thus $V_{PP}$ cannot be shorted to the word line or applied to the one terminal of the capacitor $C_\phi$. Transistors T6 and T7 can be enhancement mode devices rather than native devices, and this will obviate the possible problem of native transistors being in a depletion mode even with $V_{CC}$ on the sources of the transistors.

During a programming mode, the word line 10 is allowed to develop a programming charge of $V_{PP}$. Capacitor $C_\phi$ biases the gates of transistors T1 and T2 whereby the word line 10 is allowed to incrementally receive charge from $V_{PP}$ until the full programming charge is developed on the word line. When the clock, $\phi$, is high, a voltage of $V_{CC}$ is applied across capacitor $C_\phi$ and pumps up the voltage on the node 14 by approximately the increment $V_{CC}$ above the voltage on word line 10. This causes transistors T1 and T2 to turn on and apply charge to the word line 10 until the gate to source voltage, Vgs, of the transistors is less than or equal to the threshold of these transistors and the transistors are turned off. Thereafter, with the clock $\phi$ off, the voltage on word line 10 is applied to the gates of transistors T3 and T4 and renders the transistors conductive. A charge from $V_{PP}$ is applied to the node 14 to raise node 14 to approximately the voltage of word line 10. Thereafter, when $\phi$ goes high, the voltage on node 14 is again pumped up by the increment, $V_{CC}$, thus again rendering transistors T1 and T2 conductive and increasing the voltage on word line 10 by approximately the increment $V_{CC}$. This incremental charging of the word line and the node 14 continues until the full programming voltage $V_{PP}$ is developed on the word line 10. At that time an EEPROM cell as selected by a word line and a bit line can be programmed.

Figure 2:
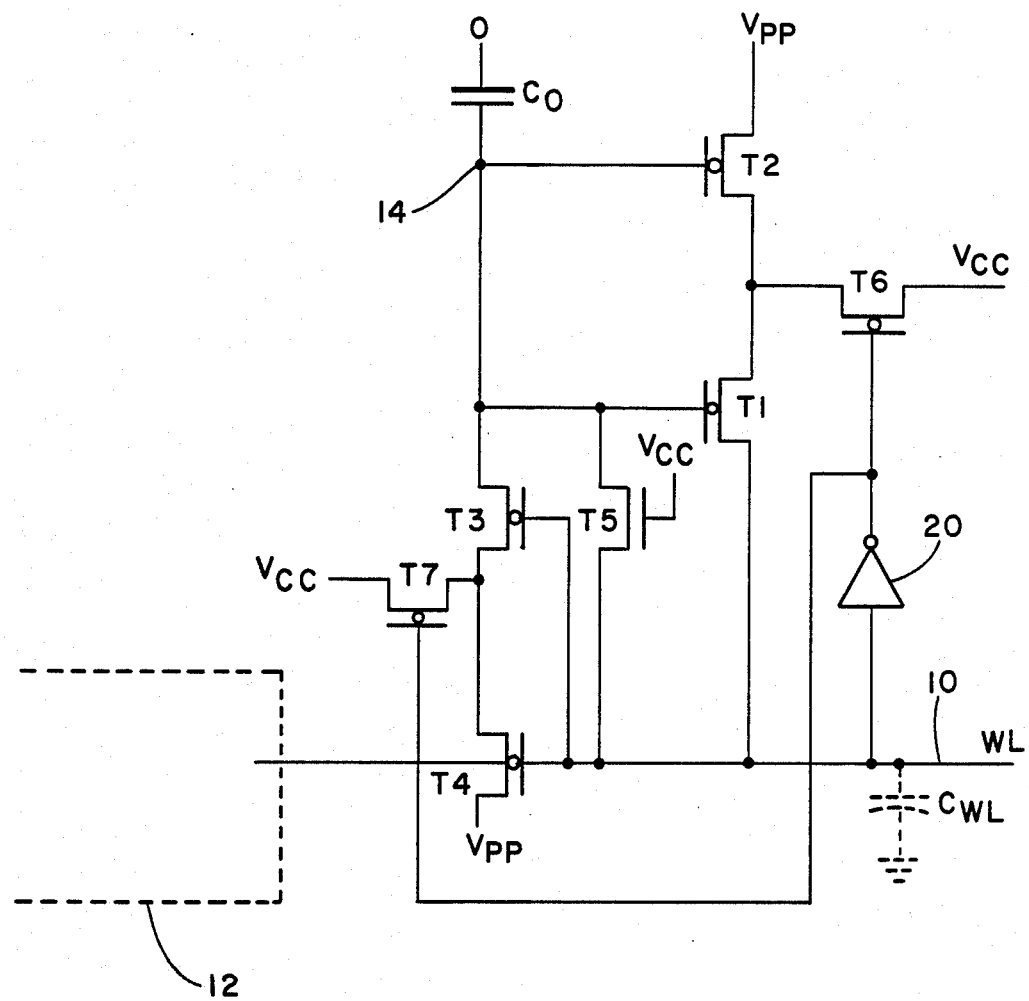
FIG. 2 is an electrical schematic of an EEPROM device and programming switch in accordance with another embodiment of the invention.

FIG. 2 is a schematic of an alternative embodiment that provides for a better operating margin of the transistors. The circuit is similar to the circuit of FIG. 1, and like elements have the same reference numerals. In this embodiment, the gate voltage for the bias transistors T6 and T7 is provided from the word line through an inverter 20. Thus when the word line is grounded the transistors T6 and T7 are conductive and provide the biasing voltage to prevent the depletion mode operation of transistors T2 and T4. However, in the case of a selected word line 10, the output of inverter 20 is 0V and provides a negative source-to-gate bias for the transistors T6 and T7, thereby rendering the transistors nonconductive.

The advantage of this approach is that when native device T2 operates in a depletion mode so does transistor T6 and a full $V_{CC}$ voltage is applied at the common mode of transistors T1 and T2 to render transistor T2 nonconductive when the word line is not selected for programming. When the word line is selected for programming the bias voltage applied through inverter 20 goes to zero volt helping to keep transistor T6 nonconductive. However, when transistor T2 operates in enhancement mode, lesser voltage is required at the common node of transistors T1 and T2; therefore, even if the native transistor T6 loses some voltage, there is no concern of inadvertent conductance.

Figure 3:
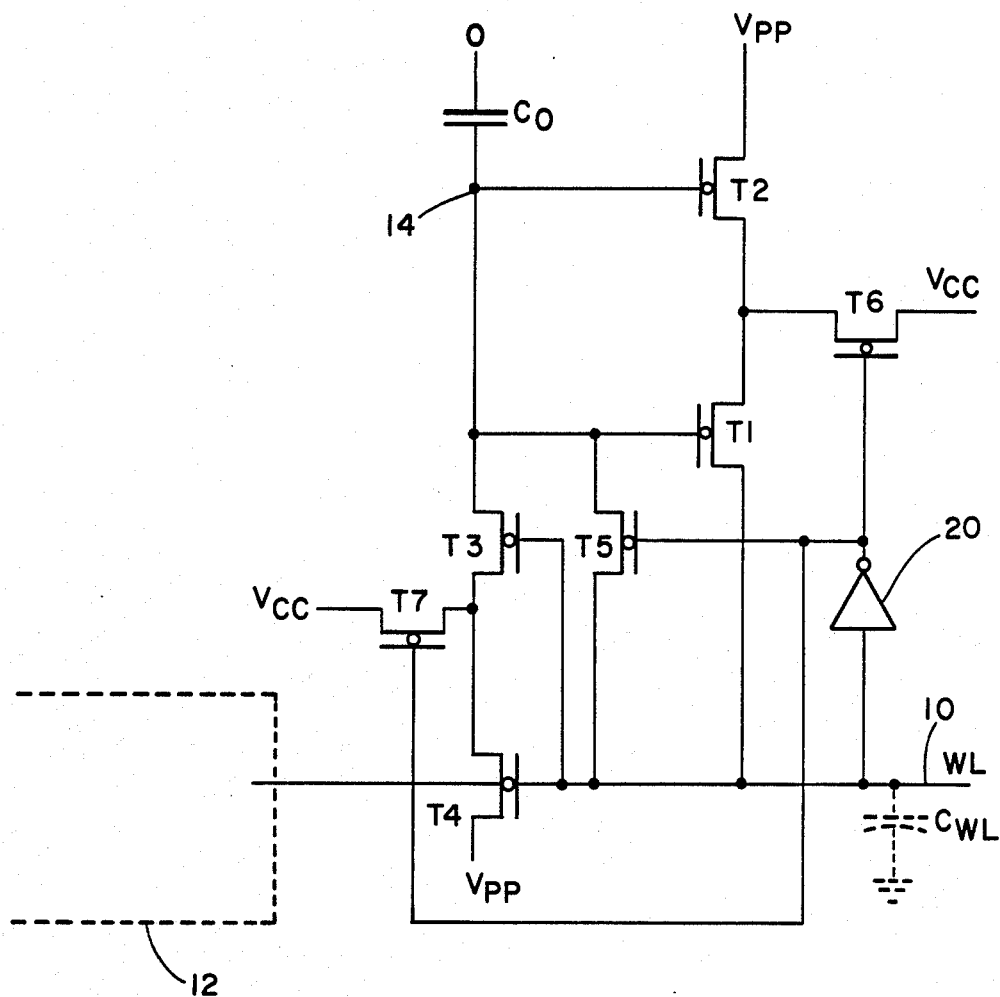
FIG. 3 is an electrical schematic of the EEPROM device and programming switch in accordance with yet another embodiment of the invention.

FIG. 3 is a schematic of another embodiment of the invention which represents a modification of the schematic of FIG. 2. Again, like elements have the same reference numerals. In this embodiment, the drain transistor T5 is a native transistor with its gate connected to receive the bias voltage from the word line 10 through the inverter 20 as to transistors T6 and T7 in FIG. 2.

In another embodiment of the invention (not shown) either transistor T6 or transistor T7 can be eliminated by connecting the common node of transistors T1 and T2 with the common node of transistors T3 and T4. However, a potential problem can develop if transistor T3 operates in a depletion mode since the coupled voltage at 14 will go the the common node of transistors T3 and T4 and hence to the common node of transistors T1 and T2. This will result in turning transistor T2 off and the switch will cease operating.

There has been described an improved programming switch for use in programming an EEPROM device at low operating voltages, $V_{CC}$. While the invention has been described with reference to specific embodiments, the description is illustrative of the invention and is not to be construed as limiting the invention. Various modifications and applications may occur to those skilled in the art without departing from the true spirit and scope of the invention as defined by the pending claims.

I claim:

1. A circuit for charging a word line in an EEPROM device comprising a word line, decoder means operably connected to said word line to prevent charge accumulation on said word line when said word line is not selected for programming and for allowing charge accumulation on said word line when said word line is selected for programming, a programming voltage ($V_{PP}$) source, a clock voltage ($\phi$) source, capacitive means having first and second terminals, said first terminal connected to said clock voltage source and said second terminal defining a charge pump node, first and second native field effect transistors serially connected between said programming voltage source and said word line, said first and second transistors having a common terminal and each of said first and second transistors having a gate electrode, means connecting said charge pump node to said gate electrodes of said first and second transistors, third and fourth native field effect transistors serially connected between said programming voltage source and said charge pump node, said third and fourth transistors having a common terminal and each of said third and fourth transistors having a gate electrode, means connecting said word line to said gate electrodes of said third and fourth transistors, and bias means connected to the common terminal of said first and second transistors and to the common terminal of said third and fourth transistors to prevent conduction of said transistors when said word line is not selected.

2. The circuit as defined by claim 1 wherein said bias means includes a fifth native transistor diode connected between a voltage potential ($V_{CC}$) and the common terminal of said first and second transistors and a sixth native transistor diode connected between a voltage potential ($V_{CC}$) and the common terminal of said third and fourth transistors.

3. The circuit as defined by claim 1 wherein said bias means includes a fifth enhancement mode diode connected between a voltage potential ($V_{CC}$) and the common terminal of said first and second transistors and a sixth enhancement mode transistor diode connected between a voltage potential ($V_{CC}$) and the common terminal of said third and fourth transistors.

4. The circuit as defined by claim 1 wherein said bias means includes a fifth transistor connected between a voltage potential ($V_{CC}$) and the common terminal of said first and second transistors, and sixth transistor connected between a voltage potential ($V_{CC}$) and the common terminal of said third and fourth transistors, and an inverter interconnected between said word line and the gate electrodes of said fifth and sixth transistors.

5. The circuit as defined in claim 1 and further including transistor means connected between said word line and said charge pump node for dissipating charge on said charge pump node when said word line is not selected.

6. The circuit as defined by claim 5 wherein said transistor means connected between said word line and said charge pump node comprises an enhancement mode field effect transistor having a gate electrode connected to said voltage potential ($V_{CC}$).

7. The circuit as defined by claim 5 wherein said transistor means interconnected between said word line and said charge pump node includes a native transistor device having a gate electrode, said bias means including an inverter interconnected between said word line and the gate electrodes of said fifth transistor, said sixth transistor, and said native transistor.

8. In charge pump circuitry for an EEPROM device in which a charge pump node is utilized to incrementally develop a programming voltage on a word line from a program voltage source, a switch operable with a variable circuit voltage, $V_{CC}$, comprising first and second native field effect transistors serially connected between said programming voltage source and said word line, said first and second transistors having a common terminal and each of said first and second transistors having a gate electrode, means connecting said charge pump node to said gate terminals of said first and second transistors, third and fourth native field effect transistors serially connected between said programming voltage source and said charge pump node, said third and fourth transistors having a common terminal and each of said third and fourth transistors having a gate electrode, means connecting said word line to said gate terminals of said third and fourth transistors, and bias means connected to the common terminal of said first and second transistors and to the common terminal of said third and fourth transistors to prevent conduction of said transistors when said word line is not selected.

9. The switch as defined by claim 8 wherein said bias means includes a fifth native transistor diode connected between a voltage potential ($V_{CC}$) and the common terminal of said first and second transistors and a sixth native transistor diode connected between a voltage potential ($V_{CC}$) and the common terminal of said third and fourth transistors.

10. The switch as defined by claim 8 wherein said bias means includes a enhancement mode transistor diode connected between a voltage potential ($V_{CC}$) and the common terminal of said first and second transistors and a seventh enhancement mode transistor diode connected between a voltage potential ($V_{CC}$) and the common terminal of said third and fourth transistors.

* * * * *